(12) United States Patent
Bayerer et al.

(10) Patent No.: US 8,222,741 B2
(45) Date of Patent: Jul. 17, 2012

(54) SEMICONDUCTOR MODULE WITH CURRENT CONNECTION ELEMENT

(75) Inventors: Reinhold Bayerer, Warstein (DE); Guido Strotmann, Anroechte (DE); Dirk Froebus, Arnsberg (DE); Reinhold Spanke, Bestwig (DE)

(73) Assignee: Infineon Technologies AG, Neubiberg (DE)

( * ) Notice: Subject to any disclaimer, the term of this patent is extended or adjusted under 35 U.S.C. 154(b) by 732 days.

(21) Appl. No.: 11/693,379

(22) Filed: Mar. 29, 2007

(65) Prior Publication Data
US 2007/0228413 A1 Oct. 4, 2007

(30) Foreign Application Priority Data

Mar. 29, 2006 (DE) .......................... 10 2006 014 582

(51) Int. Cl.
*H01L 23/52* (2006.01)
(52) U.S. Cl. ............ 257/773; 257/259; 257/4; 257/181; 257/786; 257/E23.01; 257/249; 257/150

(58) Field of Classification Search .......... 257/181–182, 257/249, 150–151, 773, 259, 4, 786, E23.01
See application file for complete search history.

(56) References Cited

U.S. PATENT DOCUMENTS

| 6,024,589 A * | 2/2000 | Hahn et al. ................. 439/212 |
| 2004/0217488 A1 | 11/2004 | Luechinger |

FOREIGN PATENT DOCUMENTS

| DE | 196 01 372 | 7/1996 |
| DE | 103 14 172 | 11/2004 |
| EP | 0 706 221 | 4/1996 |
| JP | 03174747 A | 7/1991 |
| JP | 05047989 A | 2/1993 |

* cited by examiner

*Primary Examiner* — Marcos D. Pizarro
*Assistant Examiner* — Eva Yan Montalvo
(74) *Attorney, Agent, or Firm* — Dicke, Billig & Czaja, PLLC

(57) ABSTRACT

A semiconductor module having a current connection element designed for a high current carrying capability is disclosed. In one embodiment, the current connection element includes a plurality of metal layers which rest directly on one another.

15 Claims, 10 Drawing Sheets

SEMICONDUCTOR MODULE WITH CURRENT CONNECTION ELEMENT

CROSS-REFERENCE TO RELATED APPLICATIONS

This Patent Application claims priority to German Patent Application No. DE 10 2006 014 582.8 filed on Mar. 29, 2006, which is incorporated herein by reference.

BACKGROUND

The present invention relates to a semiconductor module having at least one power semiconductor component.

Power semiconductors are normally formed in modules on circuit carriers with ceramic insulation (DCB substrates, AMB substrates, or the like). Connection elements which allow current connections to the area surrounding the semiconductor module are connected within the module to the circuit carriers or directly to the power semiconductors. These current connection elements are, for example, screwed externally to the module and have to withstand mechanical forces and torques which occur in the process, as well as during operation. For this purpose, they are mounted in housing segments. The mechanical forces also result from temperature changes and different expansion of different components of the semiconductor module, or of the power-electronic circuit. In order to avoid damaging the circuit carriers and the semiconductors in the semiconductor module, the internal contacts of these current connection elements must be relieved of the forces.

Nowadays, current connection elements such as these having expansion compensation bends of different forms are used for this purpose (see for example DE 196 01 372 A1; EP 0 706 221 A2). The disadvantage of expansion compensation bends such as these is that they lengthen the current connection element and in some cases also reduce its conductor cross section. A compromise must therefore be reached between the current carrying capability and the life of a current connection element such as this. The current carrying capability of current connection elements such as these is critically dependent on their length, because elements such as these are cooled only at the ends in the semiconductor module, and are surrounded by encapsulation compound, which provides thermally relatively good insulation, on the path to the outside of the semiconductor module. Furthermore, the expansion compensation bends increase the stray inductances in the semiconductor modules.

For these and other reasons, there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1A:
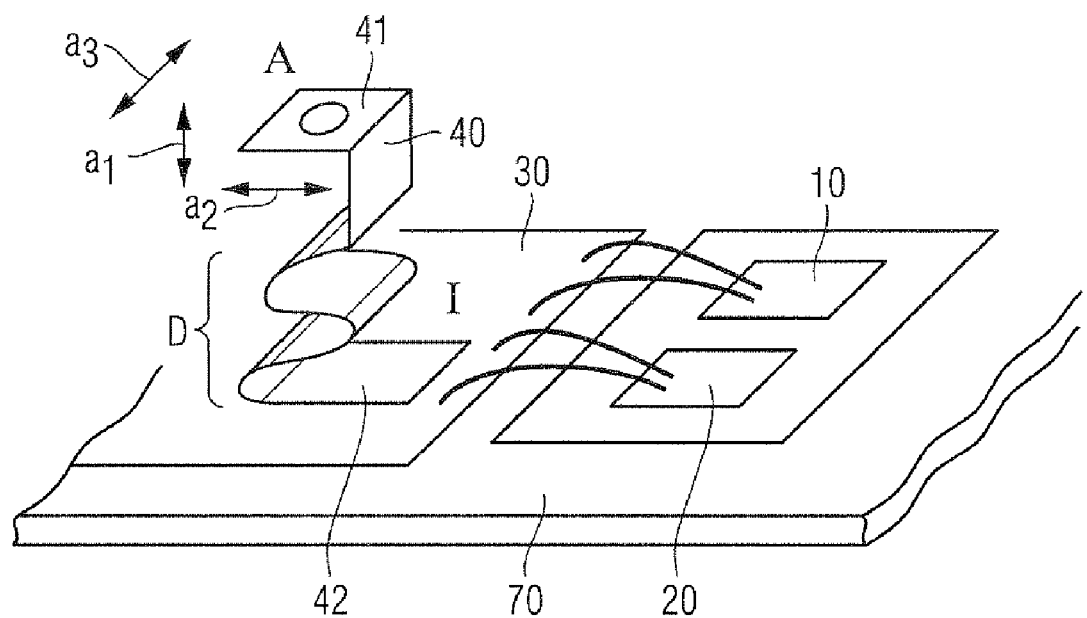
FIGS. 1A, 1B and 1C illustrate semiconductor modules of different design, with different current connection elements as are normal in the prior art.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Before describing the various embodiments of current connection elements for a semiconductor module in the following text, designs of current connection elements for semiconductor modules having at least one power semiconductor component will first of all be explained. A semiconductor module is illustrated schematically by a substrate or a mount 70. Connecting pads of power semiconductor components 10, 20 are located in or on the substrate or mount 70, and are themselves connected to an interconnect 30 by using bonding wires. Within the module, that is to say in the interior I of the module, a current connection element 40 on a module-internal contact section 42 makes contact with the interconnect 30. The current connection element 40 illustrated in FIG. 1A has a section with an expansion compensation bend D which can be deformed, in order to relieve the internal contact section 42 of the current connection element 40 of mechanical forces which act on the semiconductor module during operation and/or during its assembly. For example, forces whose directions are indicated by the arrows A1, A2 and A3 can act on a connection section 41 which is used as a current connection to the exterior A of the semiconductor module. External forces such as those which occur during assembly of the semiconductor module, are intended to be absorbed, or at least reduced, by the deformable expansion compensation bend D. However, mechanical forces also result from temperature changes and different expansion of different components in the semiconductor module, or of the power electronics located in it.

Figure 1B:
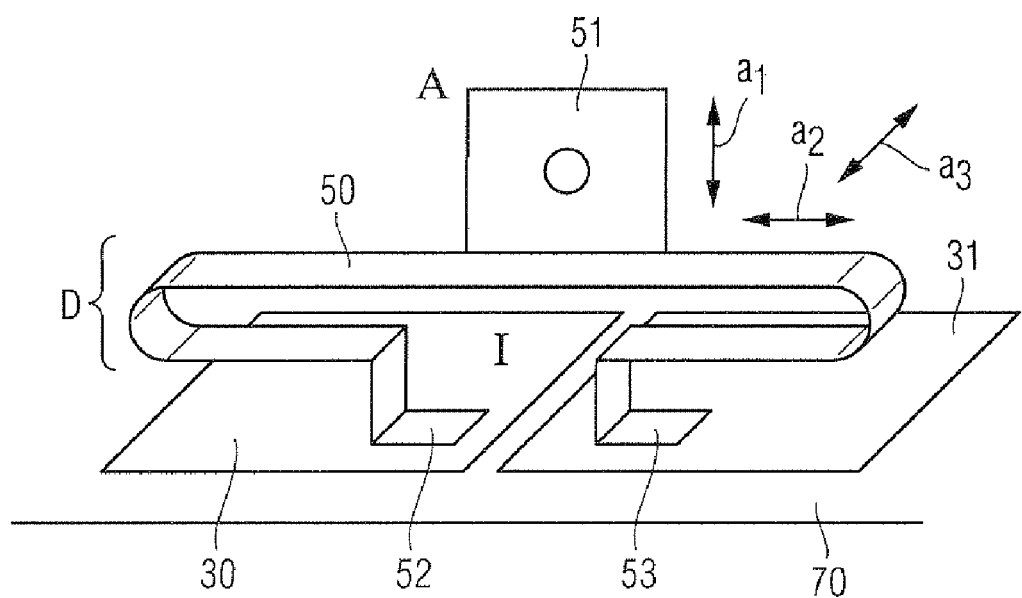

FIG. 1B illustrates a different form, which differs from the design illustrated in FIG. 1A, of a current connection element 50 with module-internal contact sections 52, 53 which jointly connect two interconnects 30 and 31, which are located on a mount or on a substrate 70, to one another and, by an outer connection section 51 of the current connection element 50, to the exterior A of the semiconductor module. An expansion compensation bend D is intended to be used to compensate for the forces indicated by the direction arrows A1, A2 and A3, thus relieving the module-internal contact sections of the current connection element 50 of these forces.

Figure 1C:
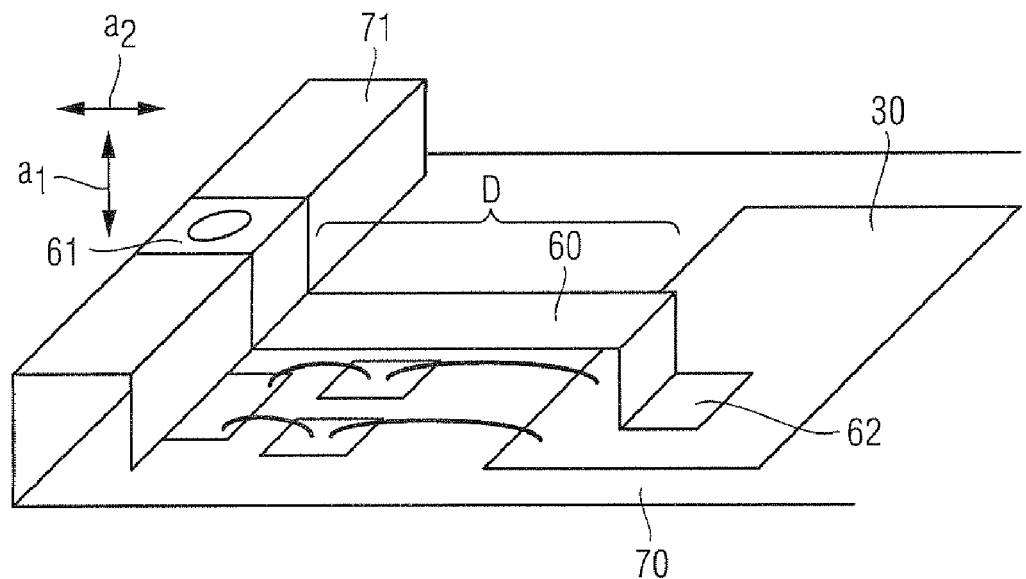

Finally, FIG. 1C illustrates a third design of a conventional current connection element 60, which has a module-internal contact section 62 that is connected to an interconnect 30 of a semiconductor module 70, an outer connection section 61 which is or can be attached to a housing segment 71 of the module 70, as well as a deformable expansion compensation bend D between the outer connection section 61 and the module-internal contact section 62.

The disadvantage of the conventional current connection elements explained above with reference to FIGS. 1A, 1B and 1C is that their expansion compensation bends D result in the respective current connection element 40, 50, 60 being lengthened. Furthermore, as in the case of the current connection element 50 illustrated in FIG. 1B, restrictions can occur in the conductor cross sections.

The current carrying capability of current connection elements such as these is critically dependent on their length, because they are cooled only at their ends in the semiconductor module and are surrounded by encapsulation compound (silicone gel), which provides thermally relatively good insulation, on the path to the outside A of the module. Furthermore, increasing the length of the current connection elements, together with their expansion compensation bends, increases the stray inductances in the semiconductor module.

In order to provide current connection elements with a large conductor cross section as far as the substrate plane of the semiconductor module and to considerably reduce the transmitted forces, one principle is to provide a current connection element in the form of a strip, and to achieve the thickness required for the current carrying capability by using a plurality of metal layers.

One or more embodiments provide a semiconductor module whose current connection elements can be routed as far as the substrate plane with a large conductor cross section and can reduce the forces which occur during installation and during operation of the semiconductor module even more effectively than in the past, while at the same time reducing the stray inductances.

In one embodiment, the semiconductor module includes a current connection element in the form of a multilayer strip, whose shape and size are designed hand to provide the required current carrying capability, and an expansion compensation bend. In one embodiment, the semiconductor module is an integrated circuit or semiconductor device.

According to one embodiment, a semiconductor module is provided having at least one power semiconductor component and at least one metallic current connection element which is designed for a current connection to the exterior of the semiconductor module and having circuit carriers and/or interconnects in the interior of the semiconductor module or for direct connection to the at least one power semiconductor component, and which has at least one expansion compensation bend which can be deformed during operation of the semiconductor module in order to relieve one or more module-internal contact section or sections of the current connection element of mechanical forces which act on the semiconductor module during operation and/or during its assembly. The current connection element is in the form of a multilayer metal strip whose metal layers rest on one another at least over a portion of its length from an outer connection section which leads to the exterior of the semiconductor module to its module-internal contact section or sections either directly or via a metallic intermediate layer, and are electrically connected to one another.

In one embodiment, the metal layers of the current connection element rest directly on one another over its entire length.

In one embodiment, the metal layers of the current connection element rest directly on one another at least on its outer connection section.

Furthermore, in one embodiment, the current connection element can have at least one central section, which is bent or angled relative to the plane of the outer connection section or with respect to the plane of the module-internal contact section or sections between the outer connection section and the module-internal contact section or sections, with the central section defining the expansion compensation bend. For example, in a current connection element designed in this way, the planes of the respective outer connection section and of the module-internal contact section or sections are located parallel to one another and the at least one central section can assume a specific angle of approximately 90° thereto.

According to one embodiment, the metal layers of the current connection element are mechanically and electrically connected to one another, for example by rivets, spot welds, or a port connection, where they do not have to slide on one another when forces act from the exterior or as a result of thermal expansion.

In the case of the current connection element according to the invention, the number of metal layers is governed at least by the forces to be transmitted. The forces transmitted are thus reduced by a factor which is governed by the number of strips (=thickness reduction per strip), in theory by power of three. Since, however, intermediate connections may be required, the transmitted forces are reduced at least by a factor of 4.

In the case of one design of the module-internal contact sections of the current connection element according to the invention, these internal contact sections or the internal contact section form or forms a plurality of feet which are designed to make contact with the circuit carriers and/or interconnects of the semiconductor module.

The design of the current connection element provides that its metal layers are connected at the outer connection section to form an integral metal pack, for example by welding, and are split into a plurality of layers within the module. These split layers may also be separate from one another, that is to say not connected, in the interior of the semiconductor module.

The metal layers of the current connection element are composed of a metal or a metal alloy having an electrical conductivity of more than 0.15 of the conductivity of copper, for example of copper or a copper alloy.

These metal layers may also be surface-coated, for example with tin, nickel or silver.

The above and further features of a semiconductor module according to the invention will be explained in more detail in the following text using various embodiments and with reference to the drawing.

Figure 2:
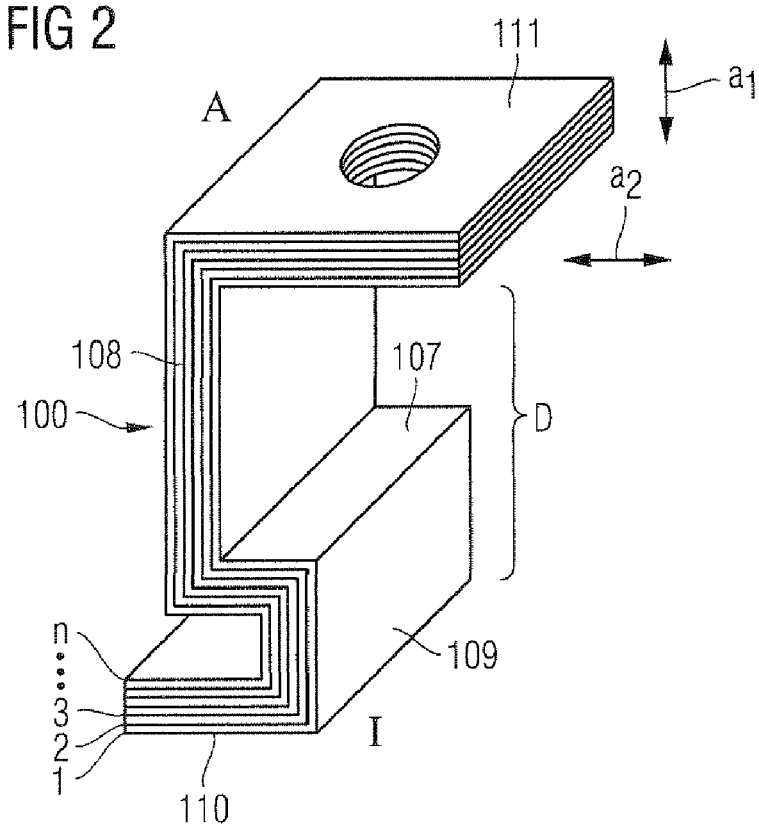
FIG. 2 illustrates a perspective view of a first embodiment of a current connection element which can be used in a semiconductor module according to the invention.

A first embodiment of a current connection element 100 which can be used for a semiconductor module is illustrated in perspective form in FIG. 2. This current connection element 100 includes a plurality of metal layers 1, 2, 3, ..., n, which are connected or joined together to form a single approximately S-shaped element. The current connection element 100 has a module-internal contact section 110 for connection to circuit carriers (not illustrated) and/or interconnects in the interior I of the semiconductor module, which is likewise not illustrated, or else to form a direct connection to a power semiconductor component (not illustrated), an outer connection section 111 for connection to the exterior A of the semiconductor module and, between the outer connection section 111 and the module-internal contact section 110, bent or angled central sections 107, 108 and 109, which form a deformable expansion compensation bend D, which is used to relieve the module-internal contact section 110 of mechanical forces which act on the semiconductor module during operating and/or during its assembly. Mechanical stresses caused by temperature changes also contribute to these mechanical forces. The directions of the forces to be compensated for by the deformable expansion compensation bend are indicated by the two arrows A1 and A2.

Figure 3:
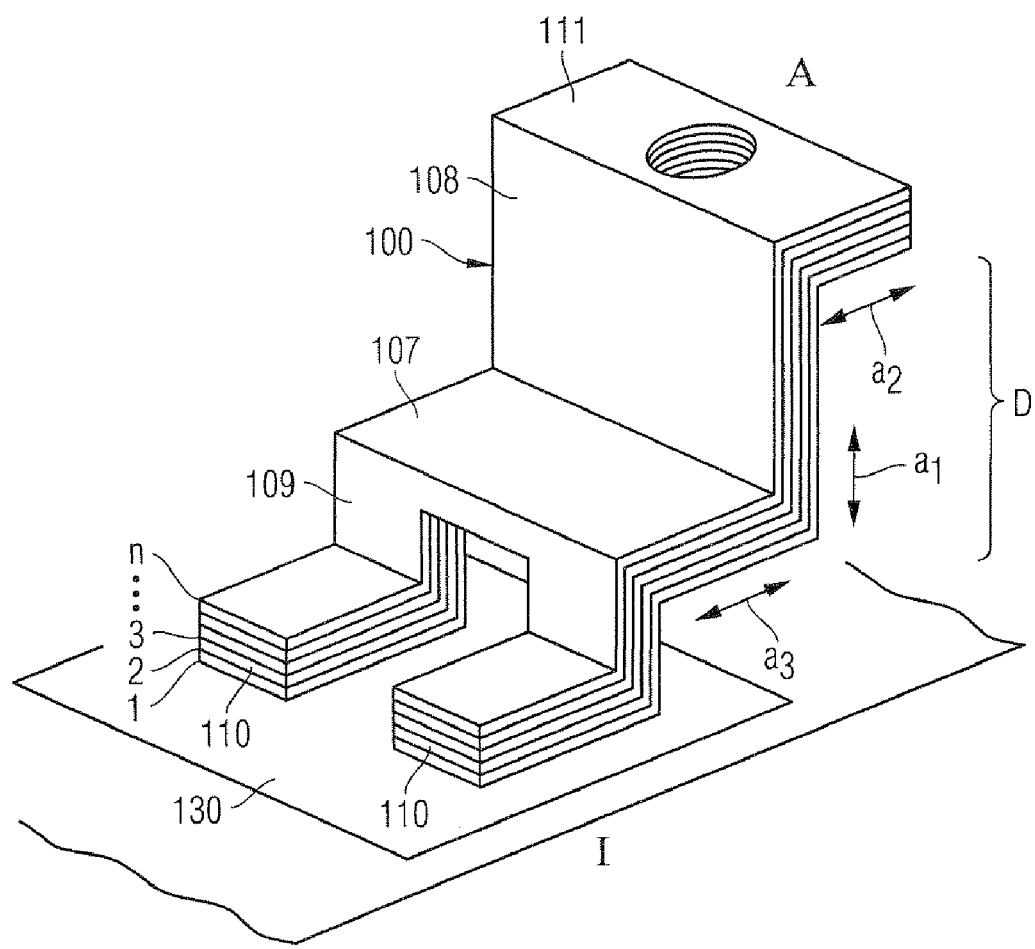
FIG. 3 illustrates a perspective view of a second embodiment of a current connection element which can be used in a semiconductor module according to the invention.

While the current connection element illustrated in FIG. 2 is approximately S-shaped, the current connection element illustrated in FIG. 3 is in the form of a staircase, and its module-internal contact section 110, which is connected directly to an interconnect 130 or to a circuit carrier, or to an electrode of a power semiconductor component, is split in two. The two current connection elements, as illustrated in FIGS. 2 and 3, are distinguished by their individual metal layers 1, 2, 3, ..., n resting directly on one another over their entire length, and by the expansion compensation bend D having relatively few sections which are angled, for example at right angles to one another. The thickness of the individual metal layers and the overall thickness of the current connection elements 100 illustrated in FIGS. 2 and 3 are chosen to provide adequate current carrying capability. This also applies to the number of individual metal layers. The thickness of the current connection elements 100 is, overall, 2 mm or 3 mm, for example.

Figure 4:
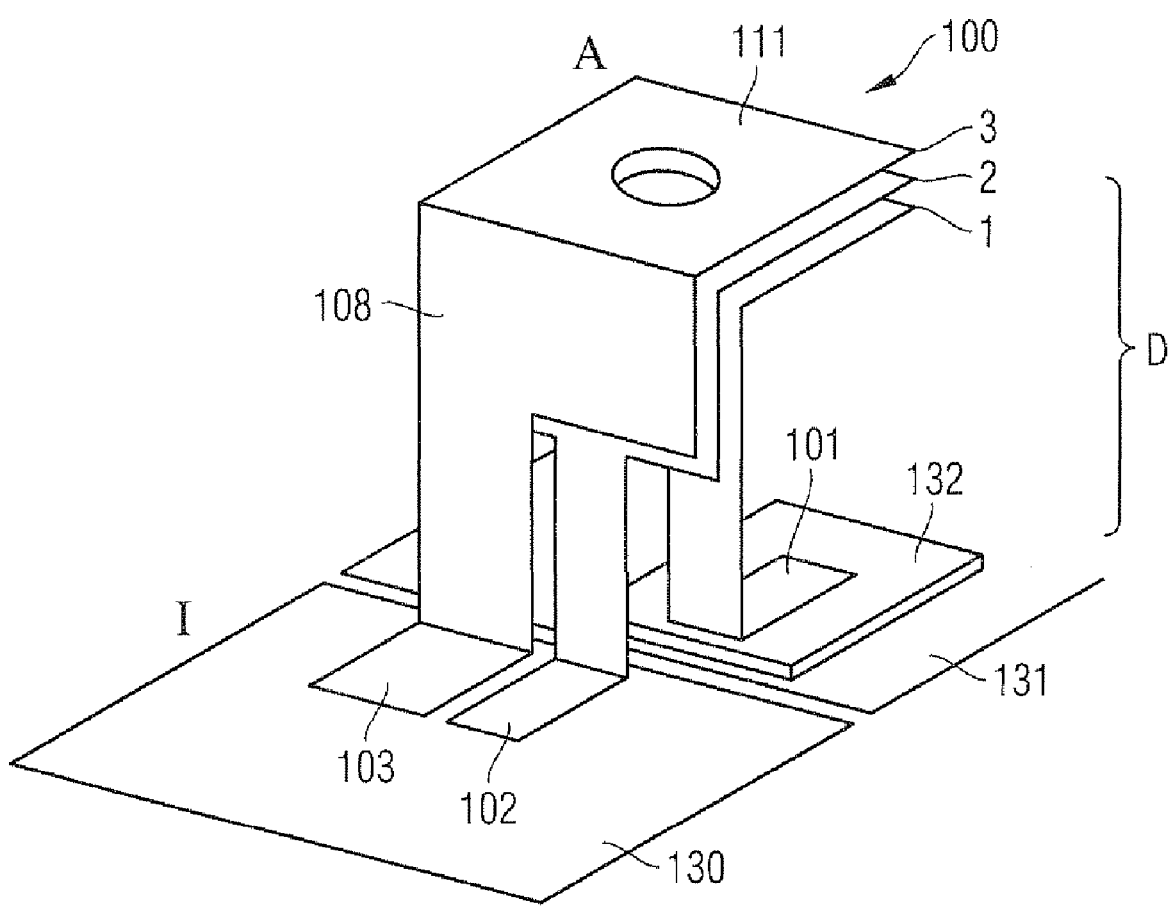
FIG. 4 illustrates a perspective view of a third embodiment of a current connection element which can be used in a semiconductor module according to the invention.

The current connection element 100 is split into a plurality of metal layers 1, 2, 3 in the third embodiment, which is illustrated in perspective form in FIG. 4, as well. On the outer connection section 111, the metal layers 1, 2, 3 are stacked one on top of the other to form a common joint area, and contact is jointly made with all of them, for example by using a screw (not illustrated), for connection to an appliance (not illustrated). In the interior I, the metal layers 1, 2, 3 of the current connection element 100 are separated into the module-internal contact sections 101, 102, 103 in order to make contact with interconnects or electrodes 130, 131, that is to say each metal layer 1, 2, 3 has different internal contact sections 101, 102, 103, so that the thickness of each module-internal contact section 101, 102, 103 corresponds to the thickness of a single metal layer 1, 2, 3. In consequence, a chip 132, an interconnect 130, 131 or a substrate (not illustrated) in the interior of the semiconductor module is also connected only by thin metal feet 101, 102, 103, thus reducing the stress resulting from thermal expansion. The feet and module-internal contact sections 101, 102, 103 may be of different sizes.

Figure 5:
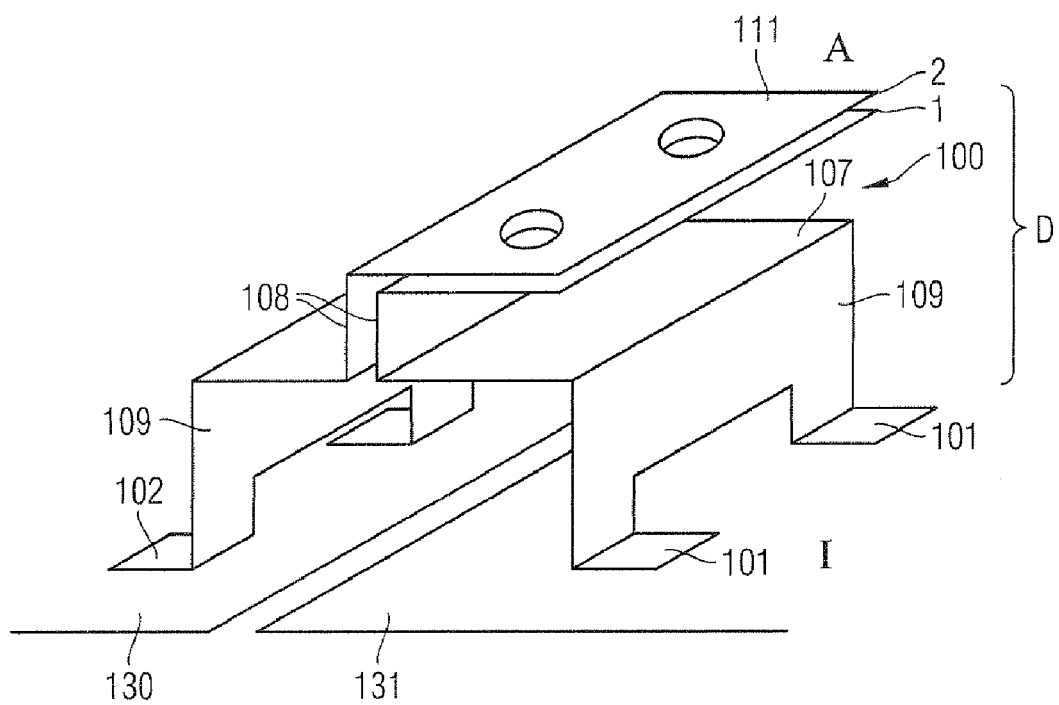
FIG. 5 illustrates a perspective view of a fourth embodiment of a current connection element which can be used in a semiconductor module according to the invention.

The fourth embodiment of a current connection element 100, as illustrated in perspective form in FIG. 5, is distinguished by two individual metal layers 1, 2 being joined together in the outer area of the semiconductor module, and by being continued in a split form internally. In consequence, the land points, that is to say the module-internal contact sections 101, 102, are optionally dynamically somewhat decoupled by stray inductances. This may be to avoid parasitic resonances. The module-internal contact sections 101 make contact in the module interior I with a first substrate or a first interconnect 131, and the module-internal contact sections 102 in the interior I of the module make contact with a second substrate or a second interconnect 130. The central sections 107, 108 and 109 of each individual metal layer 1, 2 also in this case form deformable expansion compensation bends D, although each of these can be deformed in its own right.

Figure 6A:
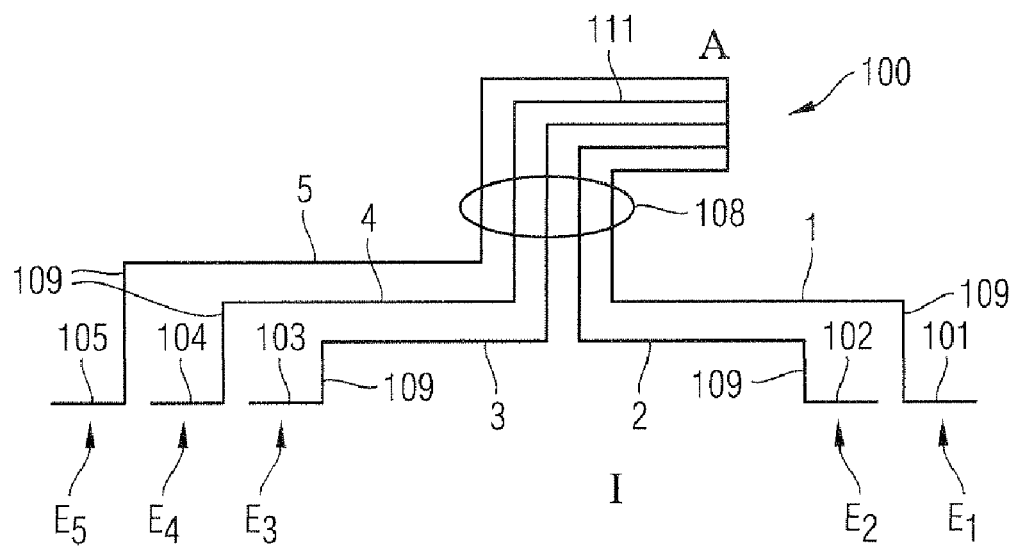
FIG. 6A illustrates a variant of the current connection element illustrated in FIG. 5, which includes five metal layers.
Figure 6B:
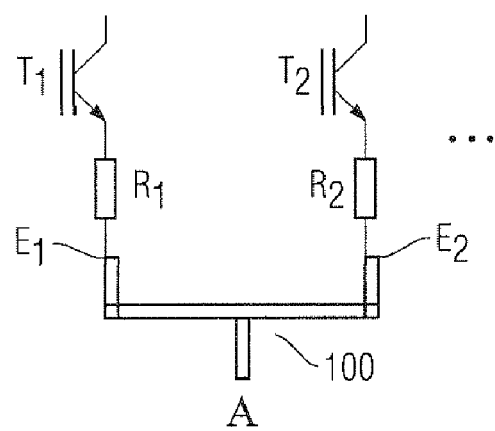
FIG. 6B illustrates a circuit diagram of power semiconductor components which are connected by a current connection element according to the invention, for example as illustrated in FIG. 5, toward the outside of a semiconductor module.

The fifth embodiment, as illustrated in FIG. 6a, of a current connection element 100 is designed in a similar manner to the current connection element 100 illustrated in FIG. 5, but five individual metal layers 1, 2, 3, 4, 5 in the interior of the module (not illustrated) make contact with different substrates or chips E1, E2, E3, E4, E5, so that the electrical coupling of the substrates or chips is provided via different metal layers, and both coupling inductances and/or coupling resistances are created, which improve the parallel connection of the chips or substrate sections with which contact is made. This prevents parasitic resonances and improves the steady-state current diagram splitting by using resistances, as is illustrated in the equivalent circuit diagram illustrated in FIG. 6B. In this figure, the transistors T1 and T2 each symbolize a power semiconductor component, and the resistors R1 and R2 indicate individual metal layers, for example 1 and 2, of the current connection element 100 as illustrated in FIG. 6A.

Figure 7A:
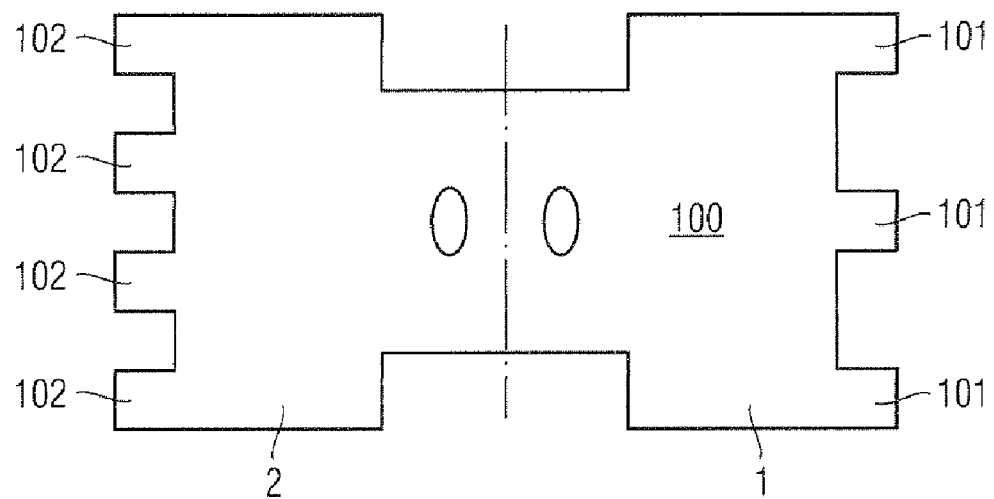
FIGS. 7A, 7B and 7C illustrate processes in the production of a current connection element according to the invention, for example as illustrated in FIG. 3.
Figure 7B:
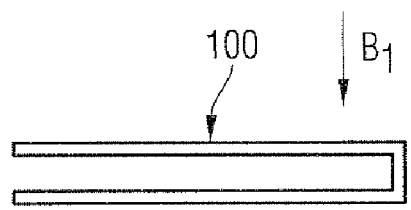
Figure 7C:
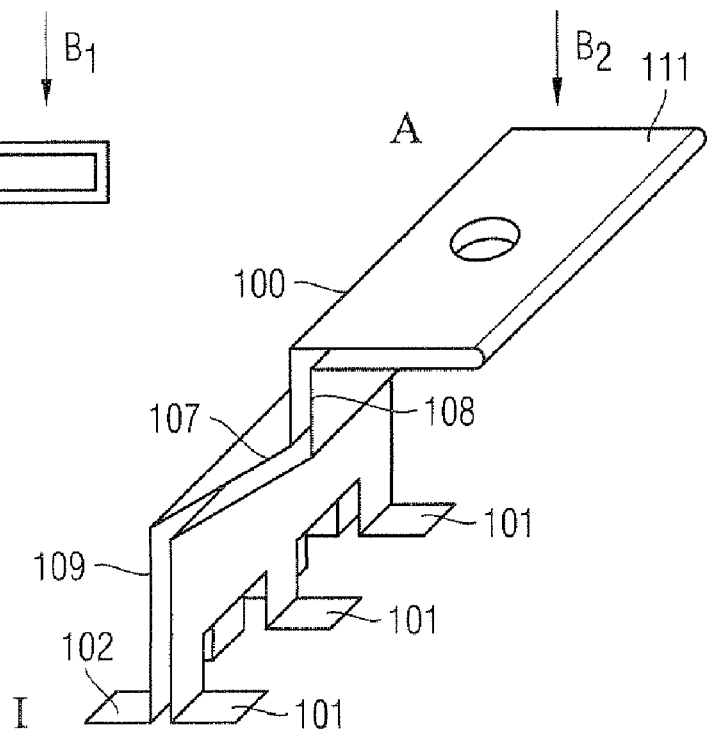

FIGS. 7A, 7B and 7C illustrate examples of processes in the production of a current connection element 100, composed of two metal layers. First of all, as can be seen in FIG. 7A, a metal strip is stamped out in the illustrated form which, apart from the module-internal contact sections 101 in the right-hand strip half 1 and the module-internal contact sections 102 in the left-hand strip section 2, have mirror-image symmetry with respect to the line of symmetry illustrated by the dash-dotted line. This metal strip is then folded together at the line of symmetry, as illustrated in FIG. 7B bending process B1) and, finally, as illustrated in FIG. 7C, it is structured by using the bending process B2 to form a two-layer current connection element 100 with multiple bends.

Figure 8A:
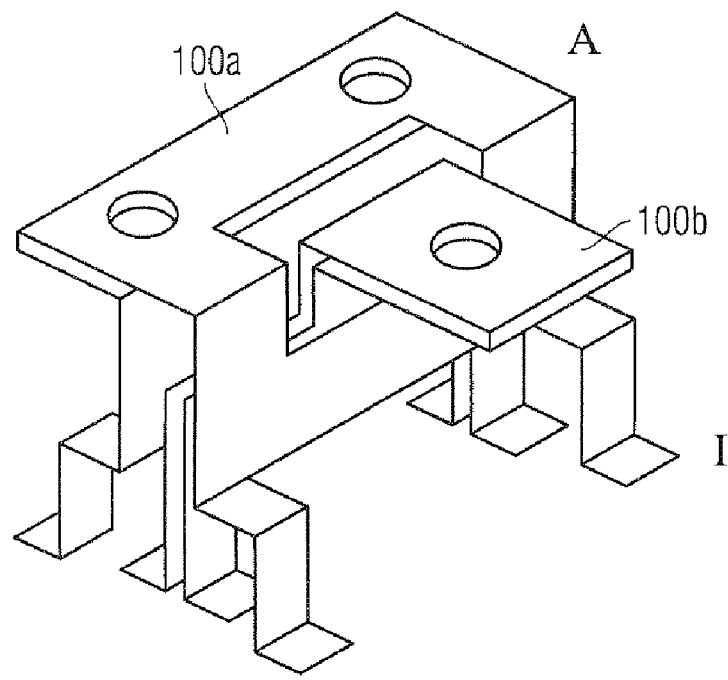
FIGS. 8A, 8B and 8C illustrate perspective views of the embodiments of two current connection elements which are designed according to the invention such that they can be interleaved in one another in order in this way to allow a space-saving current connection, which reduces the inductance, of power semiconductor components of a semiconductor module according to the invention.
Figure 8B:
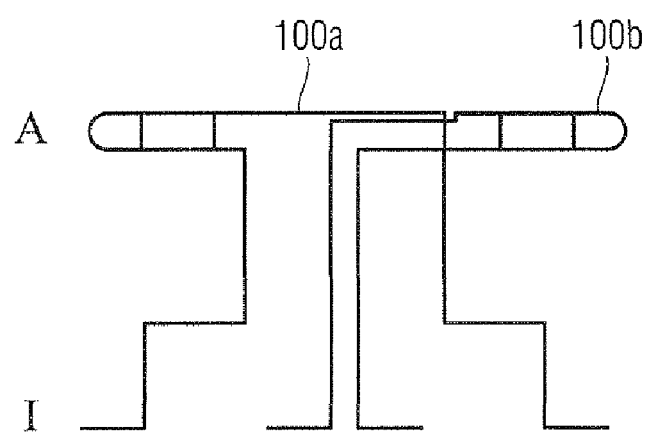
Figure 8C:
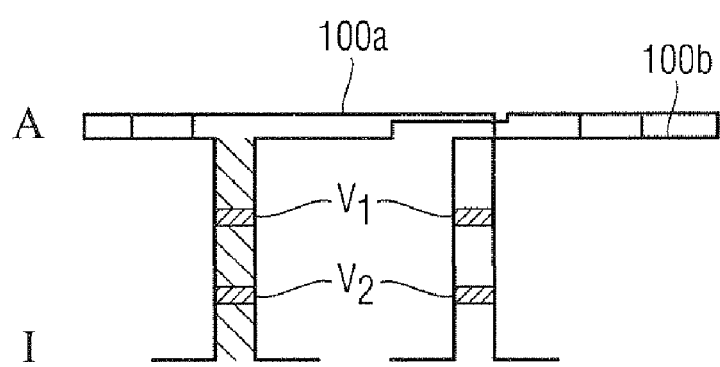

FIGS. 8A, 8B and 8C illustrate, schematically, how two current connection elements 100a and 100b can be interleaved in one another in order to reduce the inductance between two poles (for example between two electrodes of a power semiconductor component or between the positive and negative poles of a half bridge), and can be welded, riveted or pressed to one another at specific points V1, V2 (FIG. 8C). The last-mentioned measure allows the stack of metal layers as well as the current connection elements 100a, 100b which have been interleaved in one another to be handled as one part.

Figure 9A:
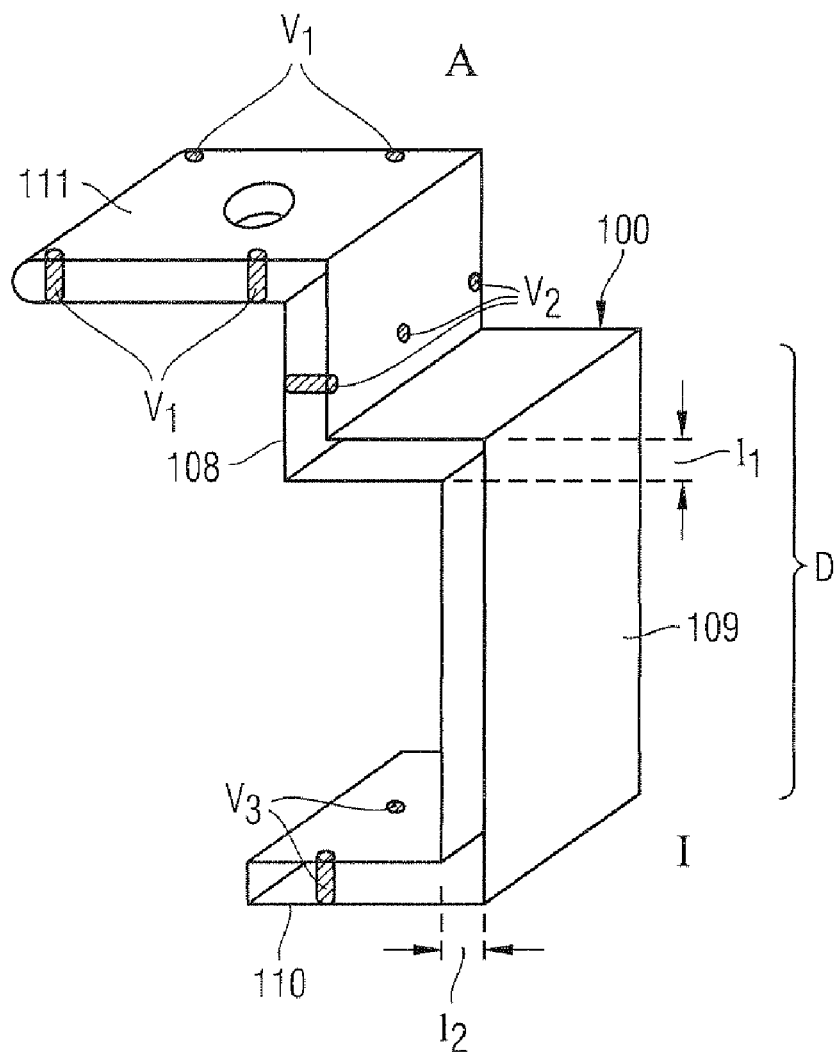
FIG. 9A illustrates a perspective view of a further embodiment of a current connection element designed according to the invention, whose metal layers are connected to one another on specific sections.
Figure 9B:
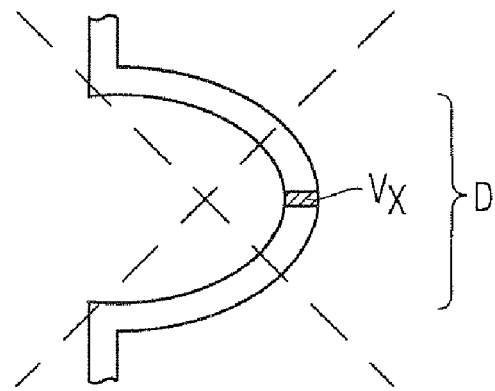
FIG. 9B illustrates a comparative example relating to FIG. 9A, which illustrates a current connection element where, although it is composed of a plurality of metal layers, its metal layers are, however, connected to one another on a section where they must slide on one another when forces act on them from the outside, or as a result of thermal expansion.

As can be seen in FIG. 9A, the metal layers of a current connection element 100 are connected to one another at specific connection points V1, V2, V3, for example by riveting, spot-welding or pressing. The connection points V1, V2 V3 are placed where there is no need for the metal layers of the current connection element 100 to slide on one another in the event of external forces or forces resulting from thermal expansion (dead points). In the intermediate sections which form the deformable expansion compensation bend D, the metal layers of the current connection element 100 are separated by distances 11, 12, as illustrated in FIG. 9A. FIG. 9B illustrates that a connection point Vx which is created in the area of the expansion compensation bend D does not fulfill the desired purpose and should therefore not be used.

In all of the embodiments which have been explained above with reference to FIGS. 2-9A, the module-internal contact sections of the current connection element or of the current connection elements 100, 100a, 100b may form a plurality of feet 101, 102, 103, 110 which are designed to make contact with the circuit carriers and/or interconnects and/or power semiconductor electrodes. The individual feet may be soldered, welded by ultrasound or welded by using a laser in the module interior. In one embodiment, the individual feet are connected to the metal, for example a copper interconnect which is applied by DCB methods on ceramic, at least 1 mm from the edge of an interconnect on the substrate. The individual feet can also be connected to nickel-plated, gold-plated or silver-plated copper tracks.

The individual metal layers 1, 2, 3, . . . , n of the current connection elements 100, 100a, 100b which have already been explained are composed of a metal or a metal alloy having high electrical conductivity, for example more than 0.15 of the conductivity of copper, such as aluminium, copper, silver or an alloy thereof. Copper is used for the metal layers. The metal layers of the current connection elements can optionally be surface-coated, for example with tin, nickel or silver.

Theoretically, the forces which are transmitted through a current connection element are reduced by a factor which is governed by the number of strips (=thickness reduction per strip), for example by a power of three. Since, however, intermediate connections may be required, these transmitted forces are reduced at least by a factor of 4.

Figure 10A:
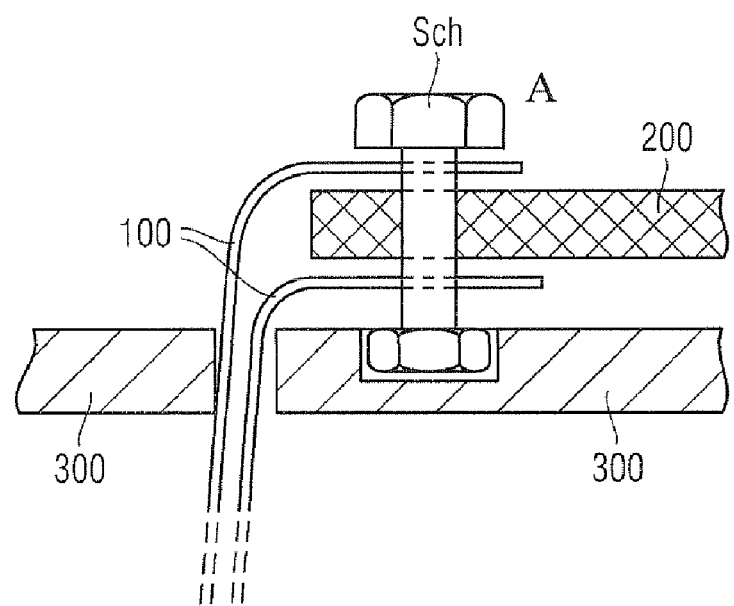
FIGS. 10A and 10B illustrate two further alternative embodiments of current connection elements which can be used for a semiconductor module according to the invention, to be precise with a screw connection on the outer connection section of the current connection elements to a bus connecting rail.
Figure 10B:
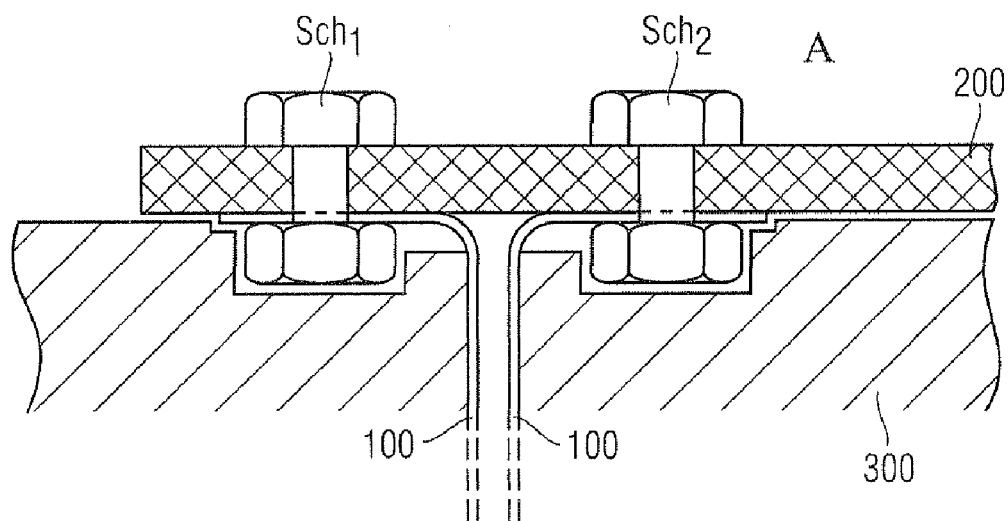

FIGS. 10A and 10B illustrate different types of position of outer connection sections of connection elements on a housing or a cover 300 of a semiconductor module. FIG. 10A illustrates two metal layers or strips of a current connection element 100, with the interposition of a connecting rail or bus rail 200, electrically connected to one another, and mechanically fixed to the housing 300, by using a screw Sch in the exterior A of the housing 300. This doubles the contact area. As illustrated in FIG. 10B, two metal layers of a current connection element 100 can be split between two screw contacts Sch1 and Sch2 in the outer area A of the housing 300, and can thus be electrically or mechanically connected to a common connecting rail or bus rail 200.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor module comprising:
   an outer connection section;
   an internal contact section; and
   at least one metallic current connection element configured for a current connection between the outer connection section and the internal contact section, the current connection element comprising a multilayer metal strip having metal layers that rest on one another at least over a portion of its length, wherein the metal layers of the current connection element are mechanically and electrically connected to one another, and wherein the connection element includes at least one deformable expansion compensation bend between the outer connection section and the internal contact section.

2. The semiconductor module of claim 1, comprising:
   a semiconductor component coupled to the internal contact section.

3. The semiconductor module of claim 2, comprising:
   the semiconductor component coupled to a circuit carrier.

4. The semiconductor module of claim 1,
   wherein the semiconductor module is an integrated circuit.

5. A semiconductor module comprising:
   at least one semiconductor component;
   at least one metallic current connection element configured for a current connection to an exterior of the semiconductor module and at least an indirect connection to the at least one power semiconductor component; and
   wherein the current connection element is in the form of a multilayer metal strip having metal layers that rest on one another at least over a portion of its length, wherein the metal layers of the current connection element are mechanically and electrically connected to one another, and wherein the connection element has at least one expansion compensation bend deformable during operation of the semiconductor module.

6. The semiconductor module of claim 5, wherein the metal layers of the current connection element rest directly on one another over its entire length.

7. The semiconductor module of claim 5, wherein the metal layers of the current connection element rest directly on one another at least on the outer connection section.

8. The semiconductor module of claim 5, wherein the current connection element has at least one central section, which is bent or angled relative to a plane of an outer connection section and with respect to a plane of a module-internal contact section or contact sections, with its central section defining the expansion compensation bend.

9. The semiconductor module of claim 8, wherein the plane of the outer connection section and that of the module-internal contact section or sections are located parallel to one another and the at least one central section comprises an angle of approximately 90° thereto.

10. The semiconductor module of claim 5, wherein the number of metal layers of the current connection element is governed at least by a combination of expected mechanical and/or thermal expansion forces.

11. The semiconductor module of claim 5, wherein a module-internal contact section or sections of the current connection element forms or form a plurality of feet which are designed to make contact with circuit carriers and/or interconnects.

12. A semiconductor module comprising:
at least one semiconductor component;
at least one metallic current connection element configured for a current connection to an exterior of the semiconductor module and at least an indirect connection to the at least one power semiconductor component; and
wherein the current connection element is in the form of a multilayer metal strip having metal layers that rest on one another at least over a portion of its length, wherein the metal layers of the current connection element are mechanically and electrically connected to one another, and wherein the metal layers of the current connection element are connected to one another by rivets, spot welds, or a port connection.

13. The semiconductor module of claim 12, wherein the number of metal layers of the current connection element is governed at least by a combination of expected mechanical and/or thermal expansion forces.

14. A semiconductor module comprising:
at least one semiconductor component;
at least one metallic current connection element configured for a current connection to an exterior of the semiconductor module and at least an indirect connection to the at least one power semiconductor component; and
wherein the current connection element is in the form of a multilayer metal strip having metal layers that rest on one another at least over a portion of its length, wherein the metal layers of the current connection element are mechanically and electrically connected to one another, and wherein the metal layers of the current connection element do not move relative to one another.

15. The semiconductor module of claim 14, wherein the number of metal layers of the current connection element is governed at least by a combination of expected mechanical and/or thermal expansion forces.

* * * * *